United States Patent [19]

De Vries

[11] 3,916,211

[45] Oct. 28, 1975

[54] CIRCUIT ARRANGEMENT FOR AN ELECTRONIC REMOTE CONTROL RECEIVER

[75] Inventor: Hans De Vries, Illnau, Switzerland

[73] Assignee: Zellweger Uster Ltd., Switzerland

[22] Filed: July 1, 1974

[21] Appl. No.: 484,778

[30] Foreign Application Priority Data

July 13, 1973 Switzerland ....................... 10240/73

[52] U.S. Cl. ..................... 307/64; 317/151; 321/10

[51] Int. Cl.² ............................................. H02J 9/00

[58] Field of Search ............ 321/10; 307/44, 64, 51, 307/56, 66, 72; 317/33 C, 151

[56] References Cited

UNITED STATES PATENTS 3,753,001 8/1973 Hiroshima et al. ................... 307/64

3,784,841 1/1974 Hosaka ................................ 321/10

FOREIGN PATENTS OR APPLICATIONS 262,146 6/1970 U.S.S.R. .............................. 317/151

*Primary Examiner*—Gerald Goldberg

*Attorney, Agent, or Firm*—Werner W. Kleeman

[57] ABSTRACT

A circuit arrangement for an electronic remote or ripple control receiver, which comprises a switching energy store associated with a switching element controllable by a receiving section and an evaluating section of the remote control receiver. A charging path with an ohmic resistance and a discharge path with a diode are in circuit between a current supply section of the remote control receiver and the switching energy store, the forward direction of this diode being directed in opposition to the direction of the charging current to the switching-energy store. The minimum response voltage of the switching element is higher than the minimum feed voltage required for the correct operation of the receiving and evaluating sections of the remote control receiver.

2 Claims, 1 Drawing Figure

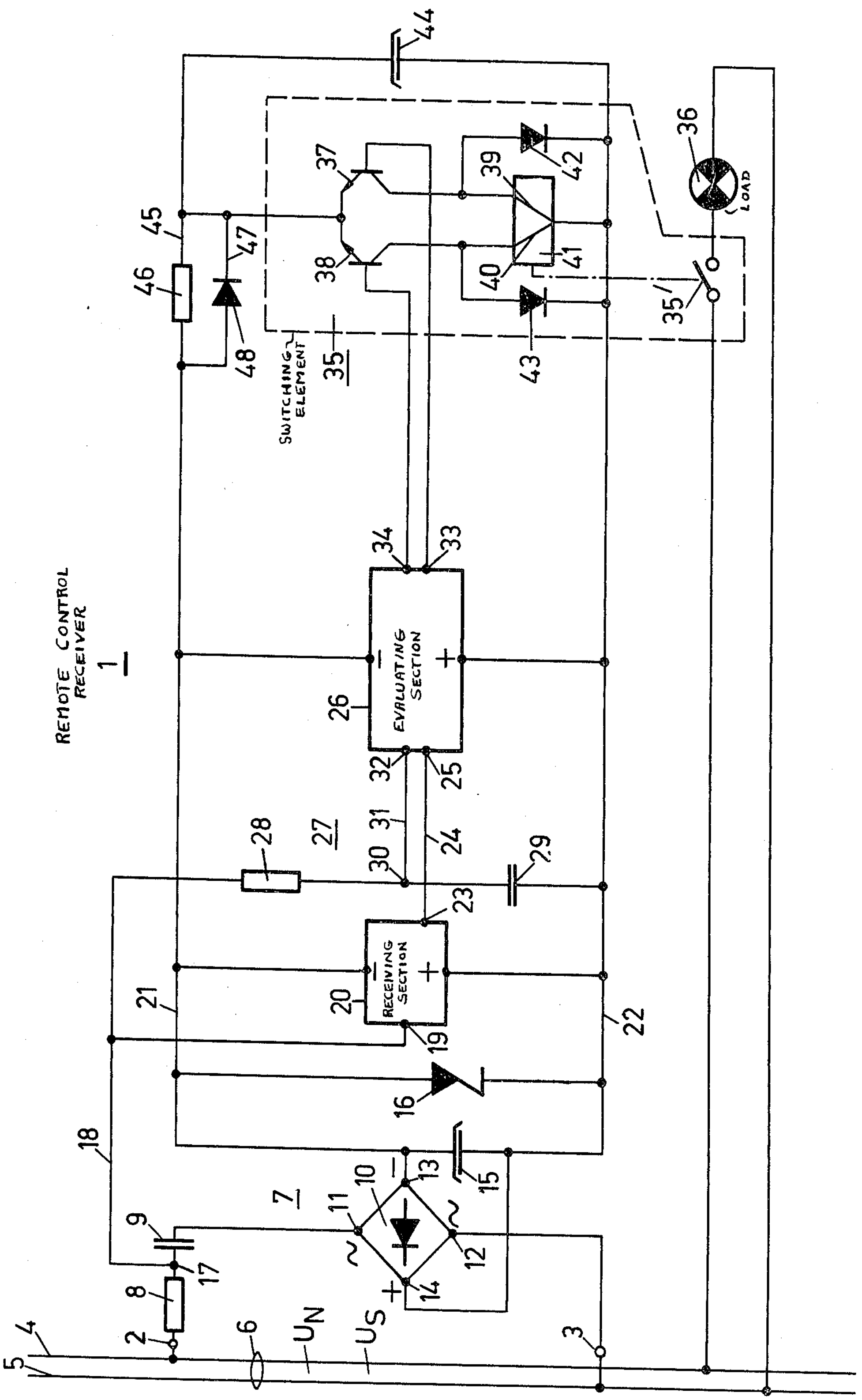
REMOTE CONTROL RECEIVER
1
EVALUATING SECTION
RECEIVING SECTION
SWITCHING ELEMENT
35
LOAD
7
UN
US

CIRCUIT ARRANGEMENT FOR AN ELECTRONIC REMOTE CONTROL RECEIVER

BACKGROUND OF THE INVENTION

The present invention relates to a new and improved construction of a circuit arrangement for an electronic remote or ripple control receiver.

The function of a remote or ripple control receiver (hereinafter simply referred to as remote control receiver) is to selectively receive and evaluate alternating-current pulses and alternating-current pulse sequences superimposed upon a power supply system at a control center or central station. Accordingly, a remote control receiver comprises a selective receiving section or receiver for the employed remote control frequency which filters out pulse sequences of a certain frequency. The selective receiving section is followed by a demodulator, generally in the form of a diode rectifier, in turn followed by an amplitude rater or evaluator which forms a d.c. voltage pulse sequence corresponding to the alternating-current pulse sequence which has been transmitted and received. This direct-current pulse sequence, also known as the pulse pattern, is then evaluated in known manner by means of an evaluating section containing a time base and a comparator. The control commands expressed by any one of the aforementioned alternating-current pulse frequencies or the direct-current pulse sequence obtained from them can be coded in any of the known codes. Accordingly, the remote control receiver comprises a decoder associated with a time base. In the decoder, a received remote control command is compared with a remote control command associated with the particular receiver and, when the two remote control commands coincide with one another, a "go" signal is formed, for example in the form of a current pulse by which a remote control switching element, for example a current-pulse switch, is actuated.

In their receiving sections, most remote control receivers comprise conventional filters, for example LC-resonance circuits or electromechanical resonant combinations, which are directly energized by the receiver, i.e. non-amplified signal energy. The energy for the direct-current pulse sequence to be generated also emanates preferably from the signal energy delivered to the receiver. An electromechanical switch mechanism operated by a synchronous motor connected to the alternating-current supply is generally used for the time base in the evaluating section. A relay or a controlled silicon rectifier can be used as the storage device for the comparator.

As a result of technical advances in the field of electronic semiconductor components, especially integrated circuits, it is now possible to produce, for example, inexpensive electronic filter arrangements, for example active RC-filters, which are used in the receiving section and fully electronic circuits for comparing and evaluating pulse patterns in the evaluating section. All these electronic components can be largely integrated for example in an integrated circuit, so that the only electromechanical switching element which remains is a switching element, for example a current-pulse switch, operable by the go signal formed in the evaluating section. Electrical equipment connected to the remote control receiver can be connected to and disconnected from the power supply system by means of this switching element in dependence upon the received remote control commands.

In view of the relatively low d.c. voltages of, for example, about 10 volts and also in view of the low current consumption of the aforementioned integrated circuits for the receiving section and evaluating section of the remote control receiver, it would in principle be possible to provide a current-supply arrangement of very low output, for example of only about 0.3 watts. In this case, however, an adequate current supply for operating the aforementioned current-pulse switch of the remote control receiver would no longer be ensured, because a current-pulse switch of this kind normally requires energy of about 0.04 joules at high current-intensity levels. This high energy can be generated in a switching energy store, for example a high-capacity electrolytic capacitor, which is kept charged through a charging path from the current-supply arrangement of the remote control receiver, so that it is able to briefly supply the necessary switching energy for the switching operations which only take place relatively rarely or at long time intervals. In this way, the voltage of the current-supply arrangement is safely prevented from being influenced by operation of the switching element.

However, undesirable difficulties can arise in cases where a switching-energy store of this kind, fed from the current-supply arrangement of the remote control receiver, is used. This is because the aforementioned integrated circuits only function reliably within a certain supply or feed voltage range. Since, even in the event of only a temporary failure in the mains voltage, the supply voltage of the receiving and evaluating section of the remote control receiver decreases at least temporarily, a go signal may be wrongly simulated in view of the fact that satisfactory operation of these sections of the remote control receiver is no longer ensured. As a result of this misleading go signal, the switching element to be remote-controlled in the remote control receiver can be brought into an incorrect switching position under the effect of the stored switching energy which is still present in the switching-energy store, even after failure of the mains voltage. Following restoration of the mains voltage, which can take place for example a few seconds or minutes after failure, the switching element to be remote-controlled in the remote control receiver would still be in an incorrect position, which of course is unacceptable.

SUMMARY OF THE INVENTION

Accordingly, an object of the present invention is to provide a circuit arrangement for an electronic remote control receiver which does not have this disadvantage, so that, even in the event of a temporary failure in the mains voltage, the remote control receiver does not carry out any incorrect switching operations.

According to the invention there is provided a circuit arrangement for an electronic remote control receiver, wherein the remote control receiver comprises a switching-energy store associated with a switching element controllable by a receiving section and an evaluating section of the remote control receiver, a charging path incorporating an ohmic resistance and a discharge path incorporating a diode being arranged between a current-supply section of the remote control receiver and the switching-energy store, the forward direction of this diode being directed in opposition to the direction of the charging current to the switching-energy store, the minimum response voltage of the aforementioned switching element being higher than the minimum feed voltage required for the correct operation of the receiving and evaluating sections of the remote control receiver.

BRIEF DESCRIPTION OF THE DRAWING

The invention is described further below by way of example with reference to the accompanying drawing, which illustrates a simplified circuit diagram of an electronic remote control receiver comprising a remote-controlled switching element with which there is associated a switching-energy store.

DETAILED DESCRIPTION OF THE PREFERRED EMBODIMENTS

Referring now to the drawing, a remote control receiver 1 has its input terminals 2 and 3 connected to two conductors 4 and 5 of an alternating-current supply 6. The conductor 4 can be for example a phase conductor and the conductor 5 a neutral conductor. However, it is alternatively possible to connect the remote control receiver 1 to two phase conductors of the power supply system. The remote control commands are superimposed in known manner upon the alternating current supply 6, to which the two aforementioned conductors 4 and 5 belong, in the form of an alternating-current pulse sequence. In addition to the mains a.c. voltage $U_N$, therefore, the signal voltage $U_S$ superimposed on it is also present at the input terminals 2 and 3.

A current supply arrangement 7 is provided for supplying current to the electronic remote control receiver 1. The current supply arrangement 7 comprises a series circuit incorporating a protective impedance 8, a series capacitor 9 and a full-wave rectifier 10 connected to the input terminals 2 and 3. The full-wave rectifier 10 is in the form of a bridge rectifier wherein the alternating-current terminals 11 and 12 are connected in the aforementioned series circuit whereas a filter capacitor 15 and a voltage limiter 16, for example in the form of a Zener diode, are connected to the direct-current terminals, i.e. to the negative terminal 13 and the positive terminal 14.

The protective impedance 8 can be in the form of, for example, a resistance or choke unaffected by surge voltages which protects the remote control receiver against the damaging effect of surge voltages occurring in the alternating-current supply 6. Only a relatively low d.c. voltage of, for example, 20 volts is required for operating the electronic circuit of the remote control receiver 1, therefore the series capacitor 9 is connected in series with the alternating-current terminals of the full-wave rectifier 10, producing the necessary voltage drop in relation to the mains voltage $U_N$. Since the current consumption of the electronic circuit is very modest, the current-supply arrangement 7 has only a low output, for example about 0.3 watt.

A line or conductor 18 leads from a circuit point or terminal 17 following the protective impedance 8 to an input 19 of a frequency-selective receiving section 20. This receiving section 20 contains selection means for example in the form of active RC-filters for the remote control frequency $f_S$. This receiving section 20 is connected to a negative busbar 21 and to a positive busbar 22, so that it receives the necessary feed voltage from the current supply arrangement 7. An output terminal 23 of the receiving section 20 is connected through a line 24 to a first input 25 of an electronic evaluating section 26 of the remote control receiver 1. The line 18 is also connected to an RC-section 27, consisting of a resistor 28 and a capacitor 29. A line or conductor 31 leads from a point or junction 30 at which the resistor 28 is connected to the capacitor 29, to a second input of the evaluating section 26.

A mains-frequency signal is delivered to the second input 32 of the evaluating section 26 through this RC-section 27. By means of this mains-frequency signal and electronic frequency dividers, a sequence of clock pulses strictly related to the mains frequency $f_N$ for an electronic time base is formed in the evaluating section 26 for evaluating a received pulse sequence. By virtue of the fact that the break frequency of the RC-section lies at about 10 Hz the always present mains harmonics are damped relative to the mains frequency.

The evaluating section 26 is fully electronic and can be produced at least partly in integrated form. The evaluating section 26 is also connected to the negative busbar 21 and to the positive busbar 22 in order to obtain the necessary feed voltage from the current supply arrangement 7. Electronic evaluators for remote control receivers and suitable for the practise of the invention are well known in the art, for example as taught in German Pat. No. 1,166,333 and German Pat. publication No. 1,814,992, incorporated herein by reference and to which reference may be readily had, so that there is no need here to go into further detail. It is merely pointed out that the evaluating section 26 comprises inter alia various electronic stores and shift registers. A received pulse sequence temporarily stored in a shift register is compared with a pulse sequence (i.e. remote control command) associated with the particular remote control receiver by means of an electronic comparator in the evaluating section 26, and, if the result of this comparison is positive, a go signal is released from a first output 33 or from a second output 34 as an actuating signal for a switching element 35 which is to be remote-controlled. A switch 35' belonging to the switching element 35 is switched on or off, depending on whether the go signal appears at the output 33 or the output 34. A load 36 can be connected to or disconnected from the power supply system 6 by means of the switch 35'.

To actuate the switch 35', a switching transistor 37 or a switching transistor 38 is rendered conductive by the signal appearing at the output 33 or 34 of the evaluating section 36, so that the one or the other of the two windings 39 and 40 of a relay 41 carries current and, as a result, switches the switch 35' on or off. Protective diodes 42 and 43 are connected in parallel with the windings 39 and 40 in order to protect the transistors 37 and 38 against inductive voltage surges or pulses.

The electronic part of the remote control receiver 1, i.e. the receiving section 20 and the evaluating section 26 only has a low power requirement; for example 0.2 watt. For economic reasons, therefore, the current supply arrangement 7 is also designed to only deliver a low output. A higher output is only temporarily required for actuating the switching element 35. The current supply arrangement 7, designed for low output for economic reasons, could not supply the energy required for that purpose within a sufficiently short time. For this reason, a switching energy store 44 in the form of a storage capacitor of adequate capacitance, for example 200 μF is operatively associated with the switching element 35.

The switching energy store 44 is connected through a charging path 45 incorporating a resistor 46 to the current supply arrangement 7. The resistor 46 can be relatively high-ohmic, for example 4000 ohms. Although as a result the storage capacitor 44 is charged relatively slowly from the current supply arrangement 7, it is subsequently maintained permanently charged, so that it is able at any time to supply the energy required for a switching operation when called upon to do so.

The switching energy store 44 is charged as long as the mains voltage $U_N$ is present at the terminals 2 and 3. Due to the very low leakage current, however, the switching energy store 44 retains its charge for a prolonged period, even in the event of a failure in the mains voltage.

In the event of a temporary failure in the mains voltage, the feed voltage for the receiving section 20 and evaluating section 26 supplied by the current supply arrangement 7 decreases and, after a while, falls below a value which represents a lower limit for the correct operation of the electronic circuits of the evaluating section 26. Below this boundary value or limit, indefinite signals can be delivered at the outputs 33 or 34. Since the switching energy store 44 is able to supply energy for actuating the switching element 35 for a prolonged period, it would be entirely possible for the switching element 35 and the switch 35' to be incorrectly actuated after a failure in the mains voltage, which is something that must be avoided.

To this end, a discharge path 47 incorporating a diode 48, whose forward direction is directed in opposition to the direction of the charging current to the switching-energy store is associated with the charging path 45. Thus, it can be seen that, when the feed voltage of the current supply arrangement 7 has fallen only slightly, i.e. by the starting voltage of the diode 48, below the voltage at the switching energy store 44, the receiving section 20 and the evaluating section 26 are also supplied with energy from the switching energy store 44 through the diode 47. Accordingly, the feed voltage for the receiving section 20 and the evaluating section 26 decreases together with the voltage present at the switching element 35 until, finally, that lower limit for the feed voltage of the evaluating circuit 26, below which irregular operation thereof is possible, is again reached. If the response voltage of the switching element 35 is higher than this lower limit for the feed voltage of the evaluating circuit 26, the switching element 35 is no longer able to function incorrectly after the feed voltage has fallen below that lower limit, because the voltage still present in that event at the switching energy store 44 is too low to allow the relay 41 to respond.

While there is shown and described present preferred embodiments of the invention it is to be distinctly understood that the invention is not limited thereto but may be otherwise variously embodied and practiced within the scope of the following claims. ACCORDINGLY,

What is claimed is:

1. A circuit arrangement for an electronic remote control receiver containing a receiving section and an evaluating section, said remote control receiver comprising a switching-energy store operatively connected in circuit with a switching element controllable by said receiving section and said evaluating section of the remote control receiver, a current supply section, a charging path incorporating an ohmic resistance and a discharge path incorporating a diode arranged in circuit between said current supply section of the remote control receiver and the switching energy store, the forward direction of said diode being directed in opposition to the direction of the charging current to the switching-energy store, the minimum response voltage of said switching element being higher than the minimum feed voltage required for the correct operation of the receiving and evaluating sections of the remote control receiver.

2. The circuit arrangement as defined in claim 1, wherein the diode is arranged in parallel with respect to said ohmic resistance.

* * * * *